(12) United States Patent
Hooper et al.

(10) Patent No.: US 8,707,200 B2
(45) Date of Patent: Apr. 22, 2014

(54) OBJECT BROWSER WITH PROXIMITY SORTING

(75) Inventors: Ian Hooper, Toronto (CA); Carlos Edel Olguin Alvarez, San Francisco, CA (US)

(73) Assignee: Autodesk, Inc., San Rafael, CA (US)

( * ) Notice: Subject to any disclaimer, the term of this patent is extended or adjusted under 35 U.S.C. 154(b) by 792 days.

(21) Appl. No.: 12/492,004

(22) Filed: Jun. 25, 2009

(65) Prior Publication Data

US 2010/0333026 A1 Dec. 30, 2010

(51) Int. Cl.
*G06F 3/048* (2013.01)

(52) U.S. Cl.
USPC ............................ 715/782; 715/825; 715/781

(58) Field of Classification Search
USPC .......................................... 715/782, 825, 781
See application file for complete search history.

(56) References Cited

U.S. PATENT DOCUMENTS

| | | | |
|---|---|---|---|
| 8,010,407 B1 * | 8/2011 | Santoro et al. ............. | 705/14.49 |
| D682,864 S * | 5/2013 | Kanalakis et al. ........... | D14/487 |
| 8,466,881 B2 * | 6/2013 | Westerman et al. .......... | 345/173 |
| 8,525,803 B2 * | 9/2013 | Lee et al. ..................... | 345/173 |
| 8,549,407 B2 * | 10/2013 | O'Neil Garcia .............. | 715/738 |
| 8,584,044 B2 * | 11/2013 | Wong ............................ | 715/851 |
| 2005/0107949 A1 * | 5/2005 | Yokota ......................... | 701/209 |
| 2005/0177303 A1 * | 8/2005 | Han .............................. | 701/209 |
| 2005/0251331 A1 * | 11/2005 | Kreft ............................ | 701/207 |
| 2009/0111487 A1 * | 4/2009 | Scheibe ..................... | 455/456.6 |
| 2010/0008255 A1 * | 1/2010 | Khosravy et al. ............ | 370/254 |
| 2011/0187706 A1 * | 8/2011 | Vesely et al. ................. | 345/419 |
| 2012/0162384 A1 * | 6/2012 | Vesely et al. .................. | 348/47 |

* cited by examiner

*Primary Examiner* — David Phantana Angkool
(74) *Attorney, Agent, or Firm* — Gates & Cooper LLP (57) ABSTRACT

A method, apparatus, and article of manufacture provide the ability to interface with objects. A computer-implemented scene having two or more objects is displayed and a corresponding list of the two or more objects is displayed in independent categories called facets and in an ungrouped flat list. A user identifies a viewpoint within the scene that establishes a location and an orientation within a space of the scene from which to view the scene objects. Dynamically and independently from additional user actions, a proximity of each of the two or more objects from the viewpoint is determined. The ungrouped list of the two or more objects is sorted based on the proximities and displayed.

28 Claims, 6 Drawing Sheets

OBJECT BROWSER WITH PROXIMITY SORTING

BACKGROUND OF THE INVENTION

1. Field of the Invention

The present invention relates generally to viewing object lists, and in particular, to a method, apparatus, and article of manufacture for providing legibility within two-dimensional (2D) large lists of objects based on a position in a three-dimensional (3D) scene.

2. Description of the Related Art

Complex 3D (and 2D) computer scenes have many discrete objects or model elements. Identifying and finding an object in 3D space can be difficult due to problems of occlusion, distance and density of objects. For this reason, most 3D applications have an abstracted view of the scene so the user can find, edit and identify objects. Typically, the solution is to show the scene as a textual 2D list. While a list can be easily scanned and does not have the occlusion or distance problems of 3D, it still suffers from the problem of density. The large number of objects in a typical scene makes it hard to find what you want. One or more embodiments of the invention solve the problems of legibility within large lists of objects and of the disconnect between a user's understanding of the 3D scene and the abstracted 2D object browser. To better understand the problems of the prior art, a description of information and object management and viewing is useful.

A common way of managing the amount of information in a given scene/drawing, is to group the objects (in the scene/drawing) according to a particular structure or hierarchy based on a taxonomy. The taxonomy or listing of objects can be represented in a "tree" format where sub-objects can be collapsed into a higher level container. Such a hierarchical grouping allows for better legibility up to a point, but can still become overloaded. Such a hierarchical grouping further suffers from the problem of strict classification wherein each object can only exist in a single location on the tree. For example, suppose a tree provides:

Pies
Chocolate
Pecan

When a chocolate-pecan pie exists, it is unclear which category it should belong to. Creating an alias or pointer from one category to the other category is an unsatisfactory solution that effectively multiplies the number of entries in the tree.

In addition to the problems described above, when working in an abstracted 2D view, the abstracted view is inherently disconnected from the 3D scene it is referencing. Such a disconnection typically results in a user selecting/electing to work in one or the other domain (2D or 3D). However, regardless of the domain selected, there is very little connection between the two domains. Acting on one object in the list (i.e. selecting, deleting, etc.) will affect the appearance in the 3D view, but this is a disjointed action/reaction kind of behavior rather than a dynamic live-link between the two representations. Further, prior art mechanisms are solely based on the selection of elements in a 2D or 3D domain. In this regard, a user may be required to select a group of objects in a 3D scene in order to highlight results in a 2D set. Such a selection and highlighting mechanism is difficult to use and fails to provide the flexibility desired by a user.

Accordingly, what is needed is the ability to easily view a large list of objects in a 3D or 2D scene while actively and dynamically maintaining a link/connection between the list of objects and the 3D/2D scene. There is also a need to solve the problems of strict classification taxonomies and of legibility with large object lists.

SUMMARY OF THE INVENTION

One or more embodiments of the invention provides a faceted classification scheme that solves the problems of strict classification taxonomies and of legibility with large object lists. Embodiments dynamically filter the list of objects to sort and indicate the relative proximity of the object to a camera position. As the camera moves in a scene (2D or 3D), the list of objects dynamically adjusts to reflect the changing proximity values. The result is that there is an immediate and visible connection between the scene and object representations that happens without any direct action on the objects. Such capability provides the object listing representation a spatial quality that adds to the user's understanding of the scene.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

Embodiments of the invention provide the ability to display a flat list of a scene's geometry based on facets that are mutually exclusive properties/attributes. The flat list is divided into groups based on the facets with each element/entity of the scene geometry listed within a group. Each of the entities is listed with a result set number indicating a total number of unique object instances described by that entity/element.

The user can select one or more elements/entities that dynamically, in real time, filters a 2D textual result set (or a result set in 3D or a graphical representation) of the objects/object instances in the scene. The result set is sorted based on the proximity of each object to a viewpoint or camera position within the 2D/3D scene. As the viewpoint (e.g., position and/or orientation) moves, the listed objects are dynamically resorted. Further, objects that are closer in proximity to the viewpoint are displayed in a more visually distinguishable manner (e.g., a larger font size, bolder print, underscore, highlighting, etc.) than those objects farther away.

Hardware Environment

Figure 1A:
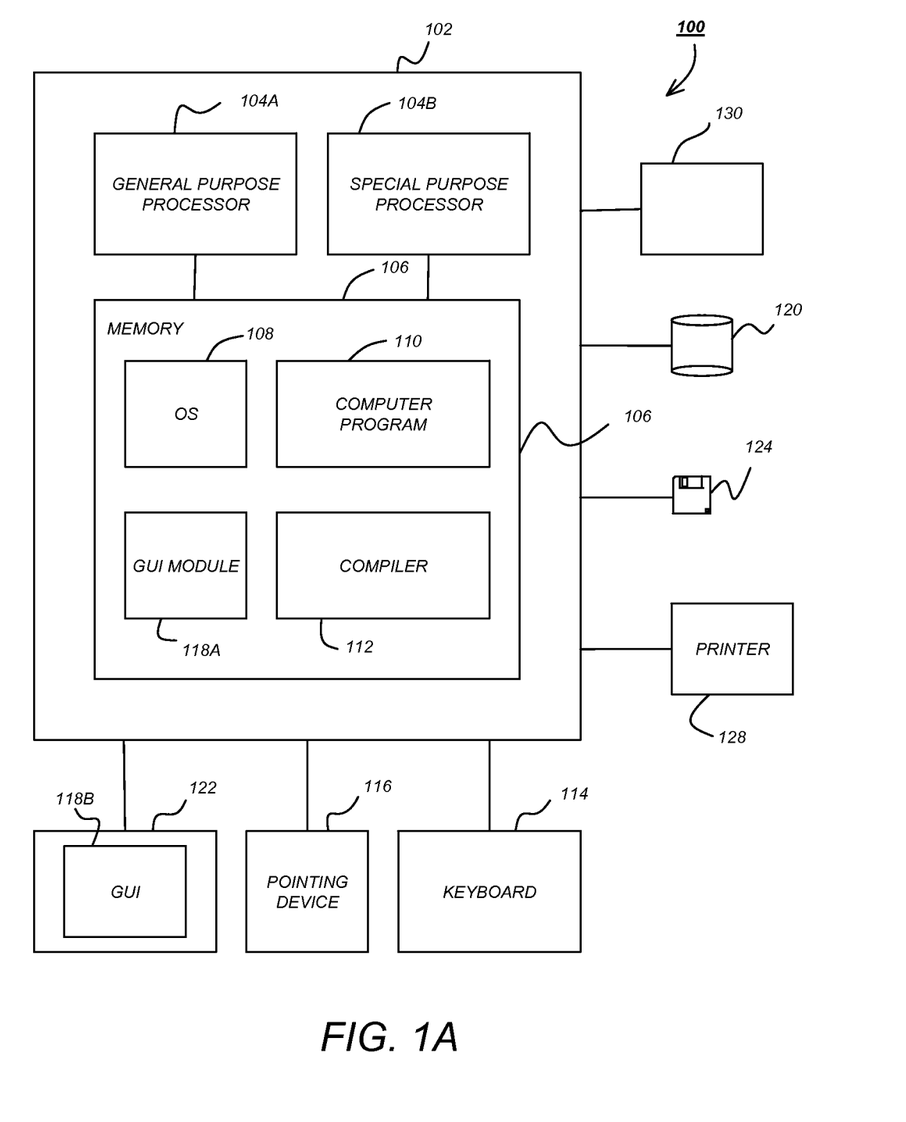
FIG. 1A is an exemplary hardware and software environment used to implement one or more embodiments of the invention.

FIG. 1A is an exemplary hardware and software environment 100 used to implement one or more embodiments of the invention. Computer 100 may be a user computer, server computer, or may be a database computer. The computer 102 comprises a general purpose hardware processor 104A and/or a special purpose hardware processor 104B (hereinafter alternatively collectively referred to as processor 104) and a memory 106, such as random access memory (RAM). The computer 102 may be coupled to other devices, including input/output (I/O) devices such as a keyboard 114, a mouse device 116 and a printer 128.

In one embodiment, the computer 102 operates by the general purpose processor 104A performing instructions defined by the computer program 110 under control of an operating system 108. The computer program 110 and/or the operating system 108 may be stored in the memory 106 and may interface with the user and/or other devices to accept input and commands and, based on such input and commands and the instructions defined by the computer program 110 and operating system 108, provide output and results.

Output/results may be presented on the display 122 or provided to another device for presentation or further processing or action. In one embodiment, the display 122 comprises a liquid crystal display (LCD) having a plurality of separately addressable liquid crystals. Each liquid crystal of the display 122 changes to an opaque or translucent state to form a part of the image on the display in response to the data or information generated by the processor 104 from the application of the instructions of the computer program 110 and/or operating system 208 to the input and commands. The image may be provided through a graphical user interface (GUI) module 118A. Although the GUI module 118A is depicted as a separate module, the instructions performing the GUI functions can be resident or distributed in the operating system 108, the computer program 110, or implemented with special purpose memory and processors.

Some or all of the operations performed by the computer 102 according to the computer program 110 instructions may be implemented in a special purpose processor 104B. In this embodiment, the some or all of the computer program 110 instructions may be implemented via firmware instructions stored in a read only memory (ROM), a programmable read only memory (PROM) or flash memory within the special purpose processor 104B or in memory 106. The special purpose processor 104B may also be hardwired through circuit design to perform some or all of the operations to implement the present invention. Further, the special purpose processor 104B may be a hybrid processor, which includes dedicated circuitry for performing a subset of functions, and other circuits for performing more general functions such as responding to computer program instructions. In one embodiment, the special purpose processor is an application specific integrated circuit (ASIC).

The computer 102 may also implement a compiler 112 which allows an application program 110 written in a programming language such as COBOL, Pascal, C++, FORTRAN, or other language to be translated into processor 104 readable code. After completion, the application or computer program 110 accesses and manipulates data accepted from I/O devices and stored in the memory 106 of the computer 102 using the relationships and logic that was generated using the compiler 112.

The computer 102 also optionally comprises an external communication device such as a modem, satellite link, Ethernet card, or other device for accepting input from and providing output to other computers.

In one embodiment, instructions implementing the operating system 108, the computer program 110, and the compiler 112 are tangibly embodied in a computer-readable medium, e.g., data storage device 120, which could include one or more fixed or removable data storage devices, such as a zip drive, floppy disc drive 124, hard drive, CD-ROM drive, tape drive, etc. Further, the operating system 108 and the computer program 110 are comprised of computer program instructions which, when accessed, read and executed by the computer 102, causes the computer 102 to perform the steps necessary to implement and/or use the present invention or to load the program of instructions into a memory, thus creating a special purpose data structure causing the computer to operate as a specially programmed computer executing the method steps described herein. Computer program 110 and/or operating instructions may also be tangibly embodied in memory 106 and/or data communications devices 130, thereby making a computer program product or article of manufacture according to the invention. As such, the terms "article of manufacture," "program storage device" and "computer program product" as used herein are intended to encompass a computer program accessible from any computer readable device or media.

Figure 1B:
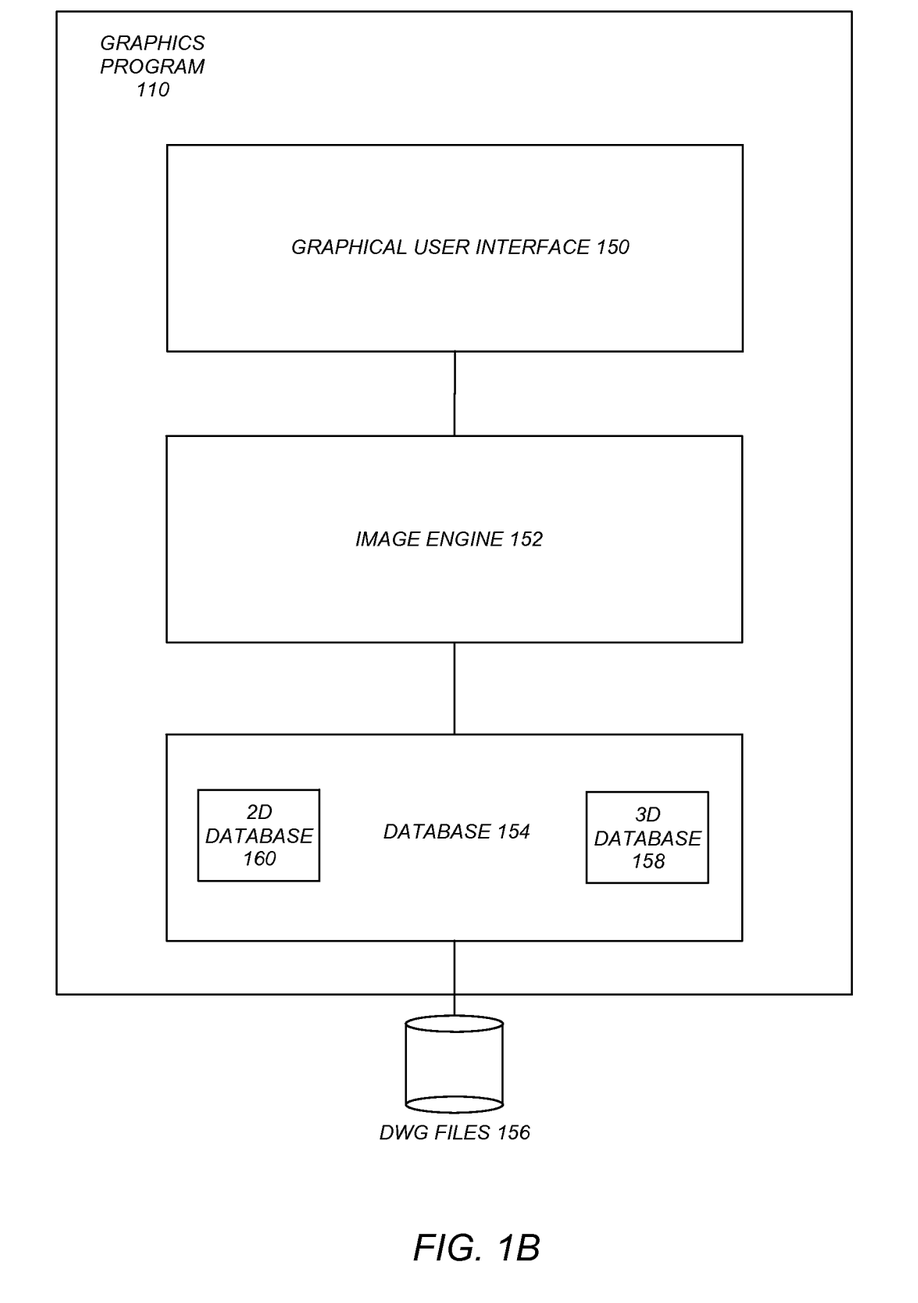
FIG. 1B is a block diagram that illustrates the components of the graphics program in accordance with one or more embodiments of the invention.

FIG. 1B is a block diagram that illustrates the components of the graphics program 110 in accordance with one or more embodiments of the invention. There are three main components to the graphics program 110, including: a Graphical User Interface (GUI) 150 (e.g., GUI module 118A), an Image Engine (IME) 152, and a DataBase (DB) 154 for storing objects in drawing files 156.

The GUI 150 displays information to the operator and provides the functionality for the operator's interaction with the graphics program 110. The Image Engine 152 processes the drawing files 156 and delivers the resulting graphics to the monitor 122 for display. In one or more embodiments, the Image Engine 152 provides a complete application programming interface (API) that allows other computer programs to interface to the graphics program 110 as needed.

The Database 154 is comprised of two separate types of databases: (1) a 3D database 158 known as the "3D world space" that stores 3D information; and (2) one or more 2D databases 160 known as the "2D view ports" that stores 2D information derived from the 3D information. Further, the database 154 may maintain object proximity data (for the proximity of objects in the 3D scene to a viewpoint/viewport/camera as described in further detail below). The database storage may be configured to provide rapid retrieval/updates to this proximity information to allow for real-time dynamic updating of a 2D list of objects as the viewport/camera changes (as described in further detail below).

Of course, those skilled in the art will recognize that any combination of the above components, or any number of different components, peripherals, and other devices, may be used with the computer 102.

Although the term "user computer" is referred to herein, it is understood that a user computer 102 may include portable devices such as cell phones, notebook computers, pocket computers, or any other device with suitable processing, communication, and input/output capability.

Software Embodiments

The computer hardware 100 described above provides the ability for a user to interface with objects in a 3D scene (e.g., view a 2D viewport of 3D data/objects). Embodiments of the invention use search and filtering technology to solve the problems of the prior art. Rather than a traditional hierarchical tree, objects in the 3D scene are shown in a faceted browser that filters facet entities/elements according to an informal hierarchy.

In the prior art, objects in a scene are shown in a strict hierarchy having a strict organizational structure (e.g., top level—car, next level—body, under body—trunk, under trunk—hinge, etc.). However, in large scenes, the hierarchical tree can be very large and difficult to browse. Further, items in the scene must be forced into a particular location in the hierarchy. For example, using the car example, if a new blanket object is created, it is unknown if the blanket should be placed into the car, car interior, miscellaneous, or another branch such as house, linens, etc. If the user does not have a preexisting knowledge base regarding the tree, it is difficult to place and/or find objects. Further, multiple copies of the object may be placed in multiple locations/branches (e.g., the blanket may exist in both the car and house branches).

Embodiments of the present invention provide for facets that filter entities/elements according to an informal hierarchy and thereby overcome the problems of the prior art. Scene geometry is presented in a flat list, but divided into two or more facets. A facet is an orthogonal (mutually exclusive) attribute or property. In this regard, all items/entities/elements that belong to a facet are mutually exclusive. For example, a home construction facet may have a wall element and a roof element which are both mutually exclusive (i.e., an object can't be both a wall and a roof). However, each element may belong to a common owner/other facet. For example, both a wall and roof may be made from the same geometry/material and hence may both be instances of the same object.

Figure 2:
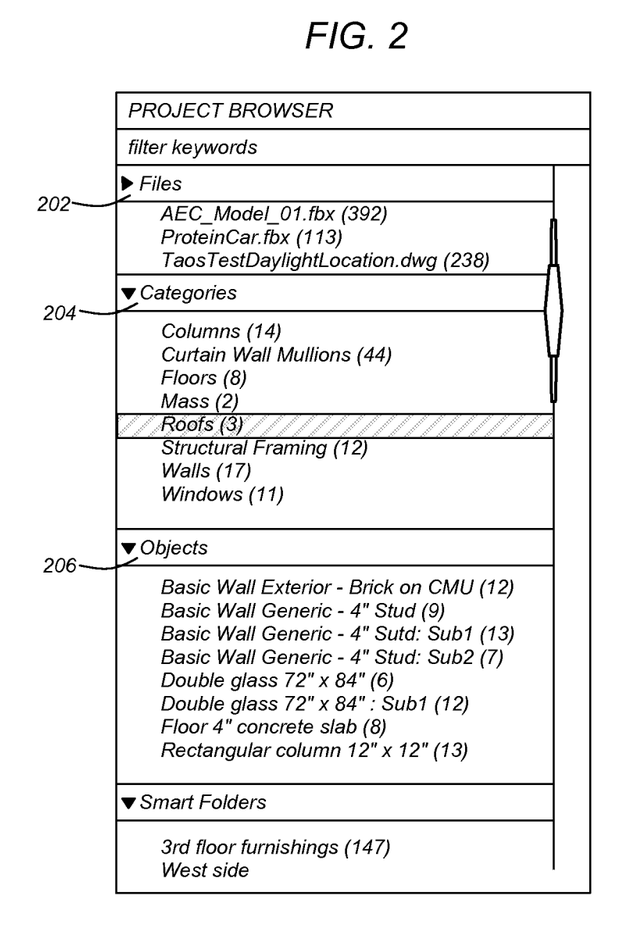
FIG. 2 illustrates facets organized according to a hierarchy for visualization purposes in accordance with one or more embodiments of the invention.

FIG. 2 illustrates facets organized according to a hierarchy for visualization purposes in accordance with one or more embodiments of the invention. As illustrated, the facets 202-206 in this particular hierarchy are Files/File Name 202, Categories 204, and Objects/Object Type 206. Other possible facets could include Family, Room, Phase, etc.

Facets 202-206 are organized according to a hierarchy for visualization purposes. Facets 202-206 may be placed in order from those with the fewest number of entities/elements to those with the largest number of entities/elements. Typically, there are fewer files 202 than objects 206. Accordingly, files 202 are located at the top of the hierarchy and objects 206 are located at the bottom. In certain embodiments, categories 204 tend to be more numerous than files 202. Accordingly, categories 204 are placed in between files 202 and objects 206. However, the order is not critical and facets 202-206 can be placed in any order in accordance with embodiments of the invention.

Each line item or entity/element in a facet 202-206 indicates the total number of unique elements described by that entity. This number provides feedback about the number of elements that will be seen in a results table/set. For example, the categories facet 204 has eight (8) listed entities/elements. Each entity has a number indicating the number of unique elements described by that entity. Thus, in FIG. 2, there are 14 column entities, 44 curtain wall mullions, 8 floors, 2 mass, 3 roofs, 12 structural framing, 17 walls, and 11 windows. Thus, the listing of all the elements within each facet 202-206 is shown in a condensed/collapsed form with the result set numbers indicating how many of each entity exists in the scene geometry.

Multiple entities/elements can be selected by the user (e.g., using a cursor control device, keyboard, stylus and tablet, etc.). Within a single facet 202-206, multiple entities can be selected and are combined to filter the selection/result set using an "OR" boolean operator so that it returns records that match at least one of the multiple search filter conditions. Alternate embodiments may provide for the use of an "AND" boolean operator or the ability for the user to select between an "AND" or "OR" boolean operator.

Selecting any entity applies a filter for matches onto the other facets and updates the element count on all entities in the other facets. The entire list of entities can also be filtered by a user defined keyword. If the element count on any entity drops to zero, then the entity is removed from the list.

At any time, the user can also view a results table/set that lists all of the matching elements/entities (object instances). This table/set is dynamically updated to reflect the changing filter selections.

Figure 3:
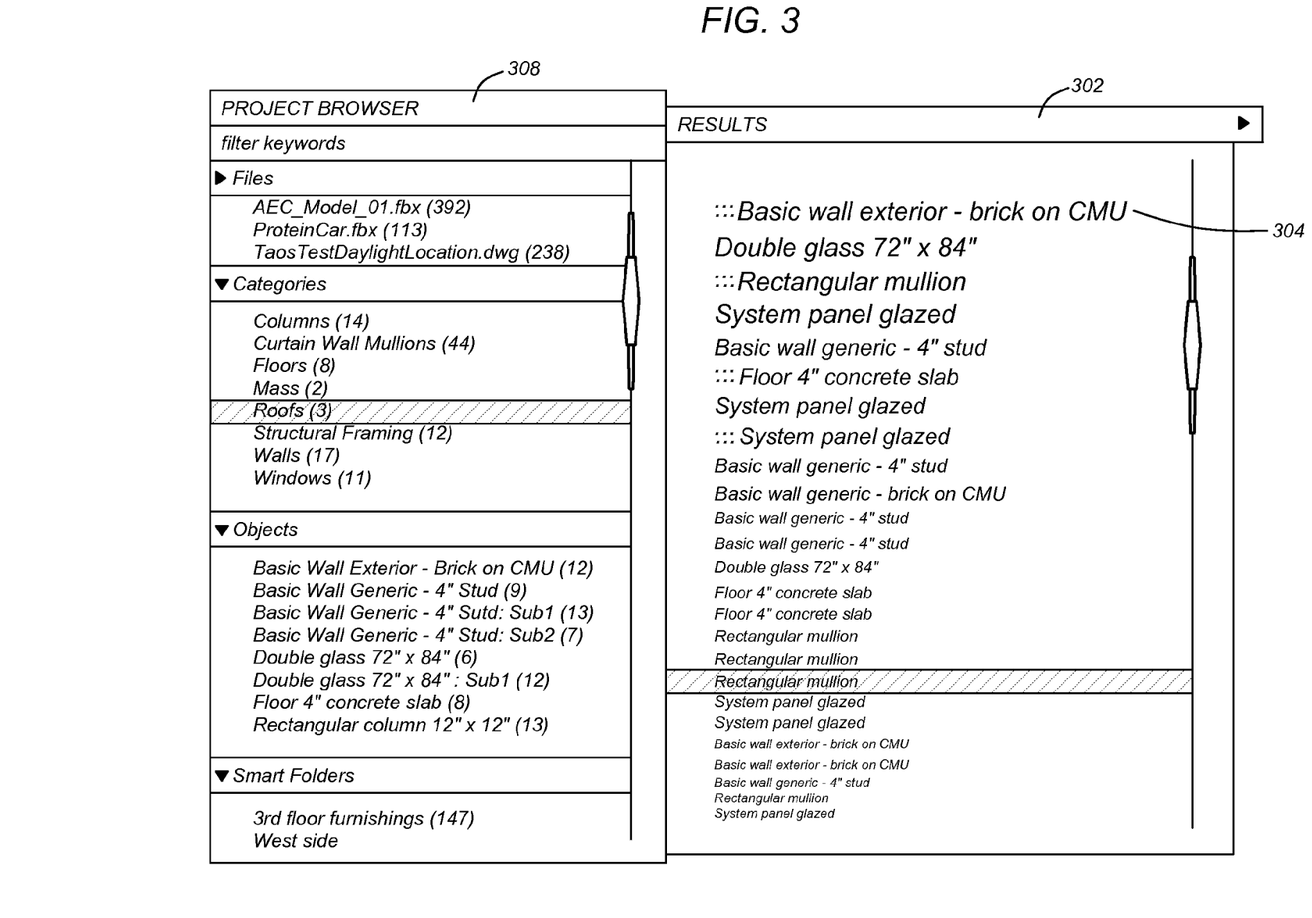
FIG. 3 illustrates a result set displayed in accordance with one or more embodiments of the invention.

FIG. 3 illustrates a result set displayed in accordance with one or more embodiments of the invention. The result set/table 302 sorts the elements according to two parameters: first by proximity to a viewpoint/camera and then alphabetically by name. It may be noted that the nature of the secondary sort is not important in embodiments of the invention. In this regard, the secondary sort may be alphabetical, but it could just as easily be any other parameter, or even user defined. In addition to the sort order, the size of font used to render the element name may be adjusted according to the proximity to the camera/viewpoint. If an element is close to the current camera position/viewpoint, then it is drawn in a large font and placed at the top of the list (e.g., basic wall exterior element 304). However, the visual distinction is not limited to font size. In this regard, the proximity sorting could be emphasized by other visual cues such as font weight, color or highlighting (for example). Elements that are farther away (i.e., from the viewpoint within the 3D scene) are shown (in the 2D list) in a smaller font and are placed lower in the list. Thus, as illustrated in table 302, the fonts are progressively smaller or less bold as they are farther removed (in proximity within the scene) from a viewpoint/camera position that is identified by the user.

Figure 4:
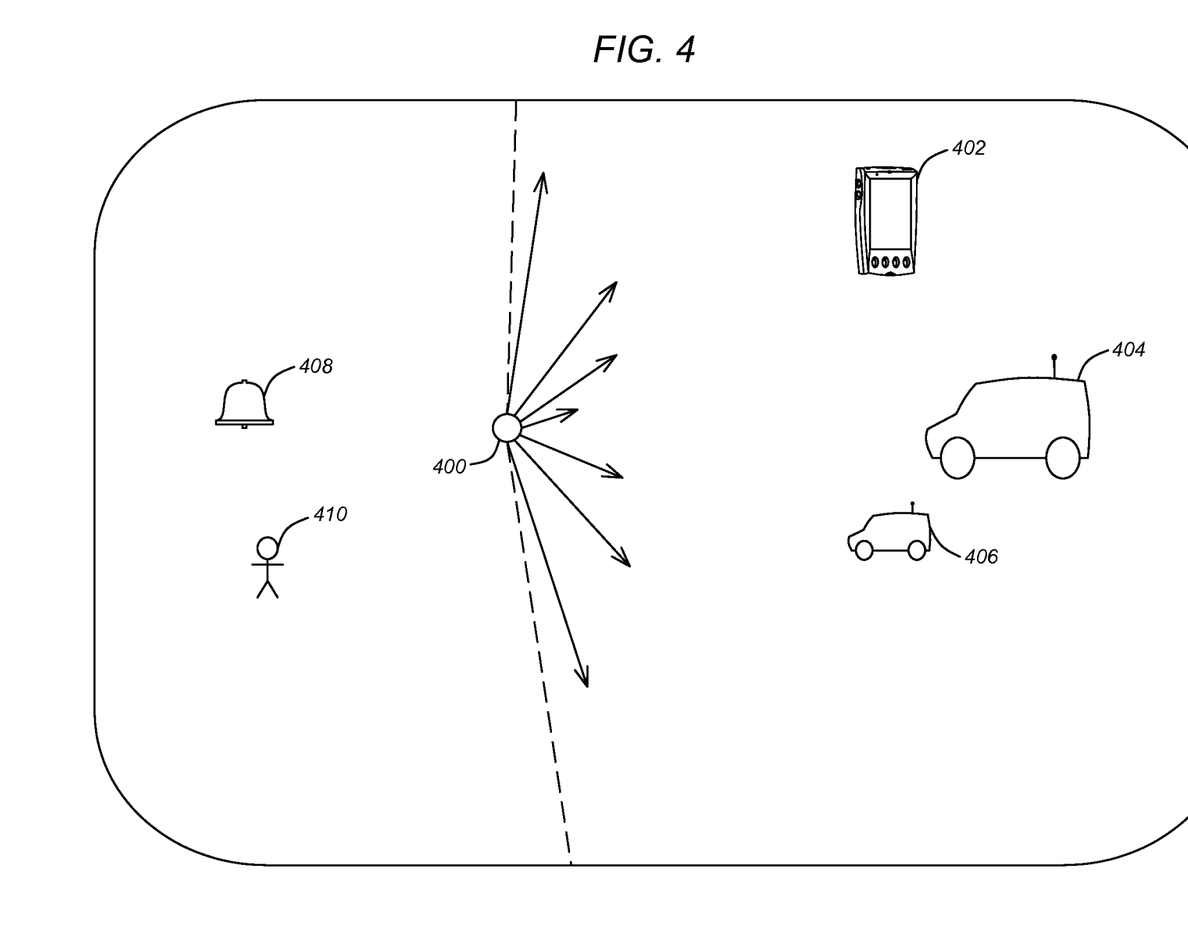
FIG. 4 illustrates an overview of a 3D scene with a defined viewpoint/camera in accordance with one or more embodiments of the invention.

FIG. 4 illustrates an overview of a 3D scene with a defined viewpoint/camera in accordance with one or more embodiments of the invention. The user has defined a viewpoint 400 that is oriented in 3D space with the view towards objects 402, 404, and 406. As illustrated, if a camera/viewport is oriented as indicated by the arrows, objects behind the viewpoint 400 and beyond the dashed line would not be visible. Thus, from a camera positioned at the designated viewpoint 400 and oriented in the direction of the arrows, object 408 and 410 would not be visible to the user. Further, the camera focal length may also be utilized to determine whether objects 402-410 are visible from the viewpoint 400. Such a focal length may be predefined or established by the user.

FIG. 4 is an overhead projection showing numerous objects 402-410 that are part of a 3D scene that could potentially be viewable depending on a viewpoint orientation. When defining the viewpoint 400 or placing the camera in a 3D scene, a first person perspective may be illustrated to the user thereby showing a different angle of the objects within the scene and eliminating certain objects (e.g., objects 408 and 410) from viewing. It may be noted that some of the objects in FIG. 4 are illustrated in a 2D nature without depth but when working in a true 3D environment, such objects, and the entire scene, would have a depth component to provide a 3D simulation or a 2D viewport/simulation of a 3D scene.

Accordingly, the orientation, location, and focal length of the viewpoint 400 may be used when displaying objects in the 2D list 302. For example, if an object is behind the camera/viewpoint viewport 400 by one foot (i.e., the orientation is such that the user is looking forward at objects but another object is one foot behind and not visible to the user), such an object may be farther down in the sorted list than an object that is two feet away but within the viewport 400 of the user (i.e., is in front of the user). In this regard, a weighting factor on the proximity may be applied that is dependent on the distance from the center of the viewport 400 and a 180 degrees dome in front of the camera/viewpoint. Thus, assuming a viewpoint 400 is located at the middle center of the screen, as objects are farther from the middle center (e.g., off to right, top, or bottom), the distance away from the middle center is divided by a greater factor/larger number. Accordingly, objects at the middle center are given the largest weight and as objects move from the middle center, such objects are assigned a lower weight and lower priority. In this regard, a weighting factor is applied that is dependent upon the location, orientation, and focal length and objects out of view may be assigned the same weight.

Users may further be provided with the ability to custom modify or define the weighting factor that is applied to the objects. Thus, users can define a weighting factor that assigns greater weight to objects directly in front of the viewpoint instead of off to the side of the viewpoint, regardless of the distance. It may be noted that the camera focal length may also be used to affect the field of view, which effectively changes what is off to the side versus what is behind the viewpoint. Such a use of focal length means that the proximity values may change if the user changes the camera focal length without even moving the position or orientation of the camera.

In some embodiments, all items not in the viewable area may be assigned the identical weighting value of 0. In such embodiments, the value/proximity assigned to such objects remains the same regardless of how close the object is to the viewpoint. In other words, all objects that are located behind the viewpoint would be assigned the same proximity value.

Items in the result set 302 may also have a limited range of sizes/visual distingiushability that may be assigned. For example, the user may opt to use a range of fonts from 5 to 20 with a maximum of 5 groups such that objects are sorted into groups of 20 point font, 16 point font, 12 point font, 10 point font, and all else below to a 5 point font. Such groupings could be assigned to distance ranges with all objects beyond a certain distance assigned to the smallest font grouping in the list (e.g., an object 2 feet away and 5 feet away may be presented on the same level because of the grouping). Users may have the ability to define the level of granularity for both the font sizes and the distance/grouping levels assigned to such font sizes.

The position of the elements (and the visual cues such as font size, weight, font etc.) dynamically updates according to the current position of the camera/viewpoint. Accordingly, as the user navigates around the 3D scene, the project browser results 302 are re-sorted to show the nearest elements in the viewport. Such re-sorting increases discoverability in the 3D space and improves the connection between the 2D abstraction of the model (i.e., the result window 302 and facet window 308) and the 3D scene. Accordingly, if the viewpoint is moved back, objects that become viewable in front of the camera would move higher up in the sorted result list 302 (e.g., based on the weighting factor applied).

In addition, elements in the result set 302 can be selected and saved as a "smart folder". A smart folder is basically a saved search where the current filters (facet selections and/or keywords) are saved along with the current camera position. Opening a smart folder basically re-runs the saved search such that the results 302 will be the same if the model is unchanged. If the model has changed, then the result set 302 will be different. With respect to keyword based selections, the user may have the option of entering or selecting a keyword. Each keyword may have a group of related keywords or may be used independently of such a group. Once one or more keywords are entered/selected, the result set 302 is filtered based on the keyword(s) (e.g., by displaying only those results having such a keyword in their description or as an attribute; or alternatively by displaying only those elements from facets having such a keyword associated with it.

Logical Flow

Figure 5:
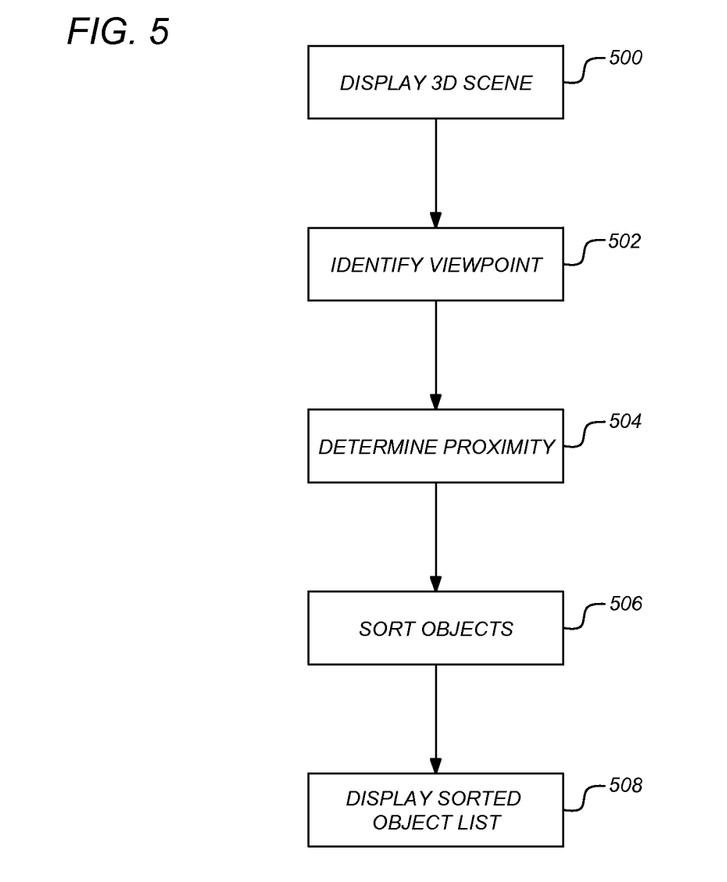
FIG. 5 is a flowchart illustrating the logical flow for interfacing with objects in accordance with one or more embodiments of the invention.

FIG. 5 is a flowchart illustrating the logical flow for interfacing with objects in accordance with one or more embodiments of the invention. At step 500, a computer-implemented scene is displayed on a display device. Such a scene includes two or more objects and may be a 2D or a 3D scene.

At step 502, user input is accepted that identifies a viewpoint within the scene. The viewpoint established a location and an orientation within a space (e.g., 3D space) of the scene to view the two or more objects. In addition, user input may be accepted that identifies a focal length for the viewpoint within the scene. Such a focal length establishes how strongly the viewpoint will converge light and determine an angle of view from the viewpoint within the scene.

At step 504, the proximity of each of the two or more objects from/to the viewpoint is determined. Such a determination is performed dynamically and independently from additional user actions. All objects that are located behind the orientation/visibility of the viewpoint may be assigned an identical proximity value. Such an assignment of the same/identical proximity value ensures that such objects are displayed similarly within the list.

At step 506, the two or more objects are sorted based on the proximities. The sorting may further include, if the list is a 2D textual list, secondarily sorting the proximity sorted textual 2D list alphabetically. In other words, the primary sort is based on proximity and the secondary sort is alphabetically based.

At step 508, the sorted object list is dynamically displayed in a list (e.g., 2D or otherwise) on a display device. If a textual 2D list is used, a size of font, that is used to render a name of the two or more object, may be adjusted according to proximity to the viewpoint. Alternatively, the objects in the list may be displayed in gradations of visual distinguishability based on the proximity of each of the two or more objects to the viewpoint. In this regard, objects closer in proximity to the viewpoint are displayed at a higher level of visual distinguishability than other objects. Such gradations of visual distinguishability may include any mechanism or manner to visually distinguish one item/object (e.g., line item in a textual list) from another item/object (e.g., font size, type of font, higlighting, boldness, line weight, underscore, italics, etc.). Alternatively, rather than a textual 2D list, a graphic, glyph, or icon may be used to represent the objects (with the same visual distinguishability attributes). Further, such a graphic may provide a mapping or hierarchy of the objects to enable efficient navigation/selection of objects in the scene. As used herein, the term "list" is intended to include any form of representation of the objects that are in a scene.

In addition, the dynamic display/update of the list of two or more objects may be filtered to display a subset of the two or more objects that are displayed in a viewport. In other words, only those objects that are currently viewable in the scene (e.g., via a viewport) may be provided in the list of objects. Thus, the dynamic display of the object browser is based on elements in the viewport (including occluded objects). Consequently, if objects are behind the user's viewpoint (e.g., in 3D space) and are not visible, the objects may not appear in the list of objects. Further, occluded objects may also not be presented in the list. Such a filtering of the list of objects displayed may be provided via a special mode in the object browser. In this regard, the filtering may not always be active but can be used to allow the user to better navigate and select elements in the scene/model. Accordingly, embodiments of the invention may also provide navigation/selection capabilities based on the list of objects that are displayed.

The displaying step 508 may further include the display/use of facets. In this regard, one or more facets may be assigned to each of the two or more objects in the scene. Each facet consists of a mutually exclusive attribute. A flat list of the scene geometry for the scene may then be displayed. Such a flat list may be divided into two or more groups with each group based on a different facet. One or more entities in each facet are listed in a respective group. Each of the entities is listed with a result set number indicating a total number of unique object instances described by that entity. Such object instances reflect and are displayed as part of the result window which consists of the list. In addition, the user may input a selection of one or more of the entities and the list that is displayed is dynamically filtered based on the selected entities.

Steps 502-508 may also be performed multiple times in a dynamic manner as the location or orientation of the viewpoint is updated/moved (e.g., via user input). In this regard, as the viewpoint is updated at step 502, the proximity of each of the objects from the viewpoint maybe dynamically determined/updated at step 504. The list is then resorted at step 506 based on the proximity (and possibly secondarily sorted alphabetically). The resorted list is then displayed on the display device.

Conclusion

This concludes the description of the preferred embodiment of the invention. The following describes some alternative embodiments for accomplishing the present invention. For example, any type of computer, such as a mainframe, minicomputer, or personal computer, or computer configuration, such as a timesharing mainframe, local area network, or standalone personal computer, could be used with the present invention. In summary, embodiments of the invention provide for the use of faceted browsing for viewing elements of a scene rather than a strict taxonomy to assist the user in understanding their model. In addition, embodiments provide dynamic interaction between a viewport camera/viewpoint and a result set based on the use of object-camera/viewpoint proximity as a sorting parameter.

In view of the above, embodiments of the invention allow a user to see all of the different facets of a model at the same time, but without the list becoming too large to see. Further, the objects may be searched from within the space of the scene, creating a tighter relationship between what is seen in a viewport (e.g., a 3D viewport) and what is displayed in a browser (e.g., a 2D browser).

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A computer-implemented method for interfacing with objects, comprising:

displaying, using a computer processor, a computer-implemented three-dimensional (3D) scene on a display device, wherein the scene comprises two or more objects;

accepting user input identifying a viewpoint within the scene, wherein the viewpoint establishes a location and an orientation within a 3D space of the scene to view the two or more objects in the scene;

displaying a two-dimensional (2D) abstraction of the 3D scene, wherein the 2D abstraction comprises a textual list of the two or more objects;

dynamically maintaining a connection between the 2D abstraction and the 3D scene;

using the computer processor, dynamically and independently from additional user actions, determining a proximity of each of the two or more objects from the viewpoint;

dynamically displaying and maintaining, using the computer processor, on the display device, the textual list of the two or more objects, wherein the textual list is dynamically sorted based on the proximity of each of the two or more objects from the viewpoint, and the displayed textual list is dynamically updated in real-time as the viewpoint is moved within the scene; and accepting user input to custom define a weighting factor that is applied to each of the two or more objects wherein:

the weighting factor defines a weight for sorting the textual list; and the weighting factor is based on the location, the orientation, and a focal length of the viewpoint.

2. The computer implemented method of claim 1, further comprising adjusting a size of font used to render a name of the two or more objects in the textual list according to proximity to the viewpoint.

3. The computer implemented method of claim 1, further comprising secondarily sorting the proximity sorted textual list alphabetically.

4. The computer implemented method of claim 1, wherein:

the two or more objects displayed in the textual list are displayed in gradations of visual distinguishability based on the proximity of each of the two or more objects to the viewpoint;

objects closer in proximity to the viewpoint are displayed at a higher level of visual distiguishability than other objects.

5. The computer implemented method of claim 1, further comprising:

accepting user input updating the location or orientation of the viewpoint within the scene;

using the computer processor, dynamically determining a proximity of each of the two or more objects from the viewpoint;

resorting the textual list based on the proximity of each of the two or more objects from the viewpoint; and dynamically displaying, using the computer processor, on the display device, the resorted textual list of the two or more objects.

6. The computer implemented method of claim 1, wherein all objects that are located behind the orientation of the viewpoint are assigned an identical proximity value.

7. The computer implemented method of claim 1, further comprising accepting user input identifying a focal length for the viewpoint within the scene, wherein the focal length establishes how strongly the viewpoint will converge light and determine an angle of view from the viewpoint within the scene.

8. The computer implemented method of claim 1, further comprising:
(a) assigning one or more facets to each of the two or more objects in the scene, wherein each facet comprises a mutually exclusive attribute; and
(b) displaying a flat list of scene geometry for the scene, wherein:
(i) the flat list is divided into two or more groups with each group based on a different facet;
(ii) one or more entities in each facet are listed in a respective group; and
(iii) each of the one or more entities is listed with a result set number indicating a total number of unique object instances described by that entity.

9. The computer implemented method of claim 8, further comprising:
accepting user input selecting one or more of the one or more entities; and
dynamically filtering the textual list of the two or more objects based on the selected entities.

10. The computer implemented method of claim 1, wherein the dynamic display of the textual list of two or more objects is filtered to display a subset of the two or more objects that are displayed in a viewport.

11. An apparatus for interfacing with objects in a computer system comprising:
(a) a computer having a processor and memory; and
(b) an application executing on the computer, via the processor, wherein the application is configured to:
(i) display, using the computer processor, a computer-implemented three-dimensional (3D) scene on a display device, wherein the scene comprises two or more objects;
(ii) accept user input identifying a viewpoint within the scene, wherein the viewpoint establishes a location and an orientation within a 3D space of the scene to view the two or more objects in the scene;
(iii) display, using the computer processor, a two-dimensional (2D) abstraction of the 3D scene, wherein the 2D abstraction comprises a textual list of the two or more objects;
(iv) dynamically maintain, using the computer processor, a connection between the 2D abstraction and the 3D scene;
(v) using the computer processor, dynamically and independently from additional user actions, determine a proximity of each of the two or more objects from the viewpoint;
(vi) dynamically display and maintain, using the computer processor, on the display device, the textual list of the two or more objects, wherein the textual list is dynamically sorted based on the proximity of each of the two or more objects from the viewpoint, and the displayed textual list is dynamically updated in real-time as the viewpoint is moved within the scene; and
(vii) accept user input to custom define a weighting factor that is applied to each of the two or more objects wherein:
(1) the weighting factor defines a weight for sorting the textual list; and
(2) the weighting factor is based on the location, the orientation, and a focal length of the viewpoint.

12. The apparatus of claim 11, wherein the application is further configured to adjust a size of font used to render a name of the two or more objects in the list according to proximity to the viewpoint.

13. The apparatus of claim 11, wherein the application is further configured to secondarily sort the proximity sorted textual list alphabetically.

14. The apparatus of claim 11, wherein:
the two or more objects displayed in the textual list are displayed in gradations of visual distinguishability based on the proximity of each of the two or more objects to the viewpoint; and
objects closer in proximity to the viewpoint are displayed at a higher level of visual distiguishability than other objects.

15. The apparatus of claim 11, wherein the application is further configured to:
accept user input updating the location or orientation of the viewpoint within the 3D scene;
using the computer processor, dynamically determine a proximity of each of the two or more objects from the viewpoint;
resort the textual list based on the proximity of each of the two or more objects from the viewpoint; and
dynamically display, using the computer processor, on the display device, the resorted textual list of the two or more objects.

16. The apparatus of claim 11, wherein all objects that are located behind the orientation of the viewpoint are assigned an identical proximity value.

17. The apparatus of claim 11, wherein the application is further configured to accept user input identifying a focal length for the viewpoint within the scene, wherein the focal length establishes how strongly the viewpoint will converge light and determine an angle of view from the viewpoint within the scene.

18. The apparatus of claim 11, wherein the application is further configured to:
(a) assign one or more facets to each of the two or more objects in the scene, wherein each facet comprises a mutually exclusive attribute; and
(b) display a flat list of scene geometry for the scene, wherein:
(i) the flat list is divided into two or more groups with each group based on a different facet;
(ii) one or more entities in each facet are listed in a respective group; and
(iii) each of the one or more entities is listed with a result set number indicating a total number of unique object instances described by that entity.

19. The apparatus of claim 18, wherein the application is further configured to:
accept user input selecting one or more of the one or more entities; and
dynamically filter the textual list of the two or more objects based on the selected entities.

20. The apparatus of claim 18, wherein the application is further configured to dynamically filter the textual list of two or more objects to a subset of the two or more objects that are displayed in a viewport.

21. A non-transitory computer readable storage medium encoded with computer program instructions which when accessed by a computer cause the computer to load the program instructions to a memory therein creating a special purpose data structure causing the computer to operate as a specially programmed computer, executing a method of interfacing with objects, comprising:
displaying, in the specially programmed computer, a computer-implemented three-dimensional (3D) scene on a display device, wherein the scene comprises two or more objects;

accepting, in the specially programmed computer, user input identifying a viewpoint within the scene, wherein the viewpoint establishes a location and an orientation within a 3D space of the scene to view the two or more objects in the scene;

displaying a two-dimensional (2D) abstraction of the 3D scene, wherein the 2D abstraction comprises a textual list of the two or more objects;

dynamically maintaining a connection between the 2D abstraction and the 3D scene;

dynamically and independently from additional user actions determining, in the specially programmed computer, a proximity of each of the two or more objects from the viewpoint;

dynamically displaying and maintaining, in the specially programmed computer, on the display device, a textual list of the two or more objects, wherein the textual list is dynamically sorted based on the proximity of each of the two or more objects from the viewpoint, and the displayed textual list is dynamically updated in real-time as the viewpoint is moved within the scene; and accepting user input to custom define a weighting factor that is applied to each of the two or more objects wherein:
    the weighting factor defines a weight for sorting the textual list; and
    the weighting factor is based on the location, the orientation, and a focal length of the viewpoint.

22. The non-transitory computer readable storage medium of claim 21, wherein:
    the two or more objects displayed in the textual list are displayed in gradations of visual distinguishability based on the proximity of each of the two or more objects to the viewpoint; and
    objects closer in proximity to the viewpoint are displayed at a higher level of visual distiguishability than other objects.

23. The non-transitory computer readable storage medium of claim 21, wherein the method further comprises:
    (a) assigning one or more facets to each of the two or more objects in the scene, wherein each facet comprises a mutually exclusive attribute; and
    (b) displaying a flat list of scene geometry for the scene, wherein:
        (i) the flat list is divided into two or more groups with each group based on a different facet;
        (ii) one or more entities in each facet are listed in a respective group; and
        (iii) each of the one or more entities is listed with a result set number indicating a total number of unique object instances described by that entity.

24. The non-transitory computer readable storage medium of claim 21, wherein the method further comprises accepting user input identifying a focal length for the viewpoint within the scene, wherein the focal length establishes how strongly the viewpoint will converge light and determine an angle of view from the viewpoint within the scene.

25. The non-transitory computer readable storage medium of claim 21, wherein the method is configured to dynamically filter the textual list of two or more objects to a subset of the two or more objects that are displayed in a viewport.

26. The computer implemented method of claim 1, further comprising:
    accepting user input that defines a search filter for the two or more objects that are displayed in the textual list;
    saving the search filter and the viewpoint in a smart folder;
    opening the smart folder, wherein the opening re-runs the saved search filter using the same viewpoint to produce an updated textual list.

27. The apparatus of claim 11, wherein the application is further configured to:
    accept user input that defines a search filter for the two or more objects that are displayed in the textual list;
    saving the search filter and the viewpoint in a smart folder;
    opening the smart folder, wherein the opening re-runs the saved search filter using the same viewpoint to produce an updated textual list.

28. The non-transitory computer readable storage medium of claim 21, wherein the method further comprises:
    accepting user input that defines a search filter for the two or more objects that are displayed in the textual list;
    saving the search filter and the viewpoint in a smart folder;
    opening the smart folder, wherein the opening re-runs the saved search filter using the same viewpoint to produce an updated textual list.

* * * * *